(12) United States Patent
Shirvani-Mahdavi et al.

(10) Patent No.: US 7,868,639 B1
(45) Date of Patent: Jan. 11, 2011

(54) METHODS AND APPARATUS FOR INTEGRATED CIRCUIT LOOPBACK TESTING

(75) Inventors: Alireza Shirvani-Mahdavi, San Jose, CA (US); George Chien, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 357 days.

(21) Appl. No.: 12/027,895

(22) Filed: Feb. 7, 2008

Related U.S. Application Data

(63) Continuation of application No. 11/433,128, filed on May 12, 2006, now Pat. No. 7,394,278.

(60) Provisional application No. 60/696,825, filed on Jul. 5, 2005, provisional application No. 60/776,123, filed on Feb. 22, 2006, provisional application No. 60/798,062, filed on May 4, 2006.

(51) Int. Cl.
*G01R 31/26* (2006.01)
(52) U.S. Cl. ...................................... 324/765
(58) Field of Classification Search ................. 324/765, 324/763, 76.19, 158.1; 455/67.14, 88, 550.1, 455/68, 69, 126; 714/718
See application file for complete search history.

(56) References Cited

U.S. PATENT DOCUMENTS

| | | | |
|---|---|---|---|
| 6,357,025 B1 * | 3/2002 | Tuttle | 714/724 |
| 6,777,971 B2 | 8/2004 | Kirloskar et al. | |
| 6,791,312 B1 | 9/2004 | Kulhalli et al. | |
| 6,940,263 B2 * | 9/2005 | Henriksson | 324/76.19 |
| 7,190,931 B2 * | 3/2007 | Casper et al. | 455/69 |
| 7,394,278 B1 * | 7/2008 | Shirvani-Mahdavi et al. | 324/765 |

OTHER PUBLICATIONS

Srenik Mehta et al., "An 802.11g WLAN SoC," *Digest of Technical Papers*, 2005 IEEE International Solid-State Circuits Conference, Feb. 7, 2005.
Srenik Mehta et al., "An 802.11g WLAN SoC," 2005 IEEE International Solid-State Circuits Conference, 2005.

* cited by examiner

*Primary Examiner*—Ha Tran T Nguyen
*Assistant Examiner*—Tung X Nguyen

(57) ABSTRACT

Methods and apparatus are provided for performing loopback testing of integrated circuits ("ICs"). In an embodiment of the invention, an IC can be tested on an undiced wafer by coupling a wireless transmitter of the IC to a wireless receiver of the IC. Core circuitry of the IC can be controlled to cause the transmitter to send at least one signal to the receiver. Upon receipt of the at least one signal, the receiver can send a signal to the core circuitry, which can determine, and possibly record, whether the transmission and receipt were successful. The invention advantageously facilitates efficient testing of unpackaged ICs at the wafer level.

21 Claims, 9 Drawing Sheets

METHODS AND APPARATUS FOR INTEGRATED CIRCUIT LOOPBACK TESTING

This application is a continuation of U.S. patent application Ser. No. 11/433,128, filed May 12, 2006 now U.S. Pat. No. 7,394,278, which claims the benefit of provisional U.S. Patent Application No. 60/696,825, filed Jul. 5, 2005, provisional U.S. Patent Application No. 60/776,123, filed Feb. 22, 2006, and provisional U.S. Patent Application No. 60/798,062, filed May 4, 2006, which are hereby incorporated by reference herein in their entireties.

BACKGROUND OF THE INVENTION

This application relates to integrated circuits ("ICs"). More particularly, this application relates to loopback testing for ICs.

Efficient testing of ICs is a key challenge in the semiconductor industry. Typically, a relatively large number of ICs may need to be automatically tested within a relatively short period of time. The tests can be used, for example, to identify defective ICs which are subsequently discarded.

Automated testing of ICs has traditionally been performed after the IC has been diced from its wafer and packaged in various materials (e.g., plastic). The packaged IC would be automatically placed into a customized holder ("socket") that was electrically coupled to input/output ("I/O") pins of the IC for testing. However, many modern ICs are used without a package and are mounted directly on a circuit board. Such unpackaged ICs provide lower cost of manufacture and reduced consumption of circuit board area. Unfortunately, these unpackaged ICs can be significantly more difficult to test than packaged ICs.

For example, it can be very difficult and costly to build sockets for holding unpackaged ICs. As a result, these ICs are typically tested while they reside on an undiced wafer using specially-designed probes.

Unfortunately, these probes often require relatively large openings on the tested ICs and a relatively large number of signal lines (e.g., to support companion ground lines), especially when the test signals contain radio-frequency ("RF") content. As such, the area requirements can make them impractical, and sometimes impossible, to use with many modern ICs.

In view of the foregoing, it would be desirable to provide methods and apparatus for efficient wafer-level testing of ICs. Furthermore, it would be desirable to achieve such wafer-level testing with relatively low additional area and complexity.

SUMMARY OF THE INVENTION

In accordance with this invention, methods and apparatus are provided for testing at least one integrated circuit ("IC") on an undiced wafer. In an embodiment of the invention, a first signal can be transmitted from transmitter circuitry of the at least one IC to receiver circuitry of the at least one IC through a transmission line. A second signal, based on the first signal, can be received at the receiver circuitry. Thereafter, a third signal can be transmitted from the receiver circuitry to core circuitry of the at least one IC in response to receiving the second signal.

In another embodiment of the invention, at least one IC on an undiced wafer can include transmitter circuitry for transmitting a first signal to receiver circuitry of the IC through a transmission line. The receiver circuitry of the IC can receive a second signal based on the first signal. The receiver circuitry can also transmit a third signal to core circuitry of the at least one IC in response to receiving the second signal. The transmitter circuitry and the receiver circuitry can be operative to send and receive, respectively, wireless data signals.

The invention can also include memory circuitry, in which a test status can be recorded in response to receiving the third signal at the core circuitry. The memory circuitry can be associated with test control circuitry external to the at least one IC. Alternatively, the memory circuitry can be associated with the core circuitry of the at least one IC. The recorded test status can indicate the success of the transmission of the first data signal, the success of the receipt of the second data signal, or both. For example, the recorded test status can indicate whether the first test signal is substantially equal to the second signal.

Core circuitry of the at least one IC can be operative to receive a fourth signal, and the transmitter circuitry can be operative to transmit the first signal in response to the core circuitry receiving the fourth signal. The at least one IC can include a plurality of ICs on the undiced wafer, and the fourth signal can be received at each of the ICs substantially simultaneously. The fourth signal can be received from test control circuitry external to the at least one IC. The invention can include a power supply associated with the external test control circuitry, and the power supply can provide a power supply voltage to the core circuitry of the at least one IC. The core circuitry can be operative to transmit a fifth signal to the test control circuitry in response to receiving the third signal at the core circuitry.

The at least one IC can include driver circuitry coupled to the transmission line. The driver circuitry can also be coupled to an output of a variable-gain amplifier of the transmitter circuitry. The driver circuitry can be activated.

In addition, the receiver circuitry of the at least one IC can include mixer circuitry coupled to the transmission line. The receiver circuitry can further include low-noise amplifier circuitry coupled to the transmission line. In addition, the at least one IC can include loopback signal receiver circuitry coupled to both the transmission line and the mixer circuitry. The loopback signal receiver circuitry can be activated.

In yet another embodiment of the invention, at least one IC on an undiced wafer can include transmitter means for transmitting a first signal to receiver means of the IC through a transmission line. The receiver means of the IC can receive a second signal based on the first signal. The receiver means can also transmit a third signal to processing means of the at least one IC in response to receiving the second signal. The transmitter means and the receiver means can be operative to send and receive, respectively, wireless data signals.

The invention can also include memory means, in which a test status can be recorded in response to receiving the third signal at the processing means. The memory means can be associated with test control means external to the at least one IC. Alternatively, the memory means can be associated with the processing means of the at least one IC. The recorded test status can indicate the success of the transmission of the first data signal, the success of the receipt of the second data signal, or both. For example, the recorded test status can indicate whether the first test signal is substantially equal to the second signal.

Processing means of the at least one IC can be operative to receive a fourth signal, and the transmitter means can be operative to transmit the first signal in response to the processing means receiving the fourth signal. The at least one IC can include a plurality of ICs on the undiced wafer, and the fourth signal can be received at each of the ICs substantially simultaneously. The fourth signal can be received from test control means external to the at least one IC. The invention can include power supply means, associated with the external test control circuitry, for transmitting a power supply voltage to the processing means of the at least one IC. The processing means can be operative to transmit a fifth signal to the test control means in response to receiving the third signal at the processing means.

The at least one IC can include driver means coupled to the transmission line. The driver means can also be coupled to an output of amplifier means of the transmitter means. The driver means can be activated.

In addition, the receiver means of the at least one IC can include mixer means coupled to the transmission line. The receiver means can further include low-noise amplifier means coupled to the transmission line. In addition, the at least one IC can include tuned means coupled to both the transmission line and the mixer means. The tuned means can be activated.

The invention therefore advantageously allows testing at least one IC on an undiced wafer. Advantageously, the invention allows such testing with relatively low additional area and complexity.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
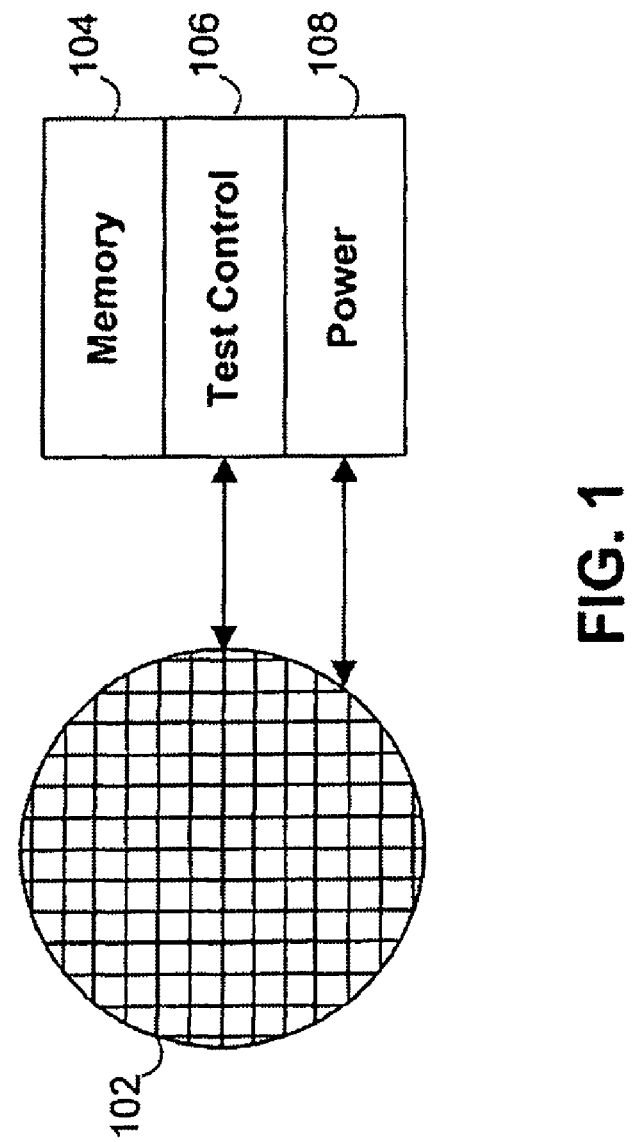
FIG. 1 is a diagram of an illustrative wafer testing system according to an embodiment of the invention.

FIG. 1 is a diagram of an illustrative wafer testing system according to an embodiment of the invention. Wafer 102 preferably includes a plurality of integrated circuits ("ICs") that have been fabricated. The ICs can include, for example, programmable logic devices ("PLDs"), application-specific integrated circuit ("ASICs"), or circuits with characteristics of both PLDs and ASICs. Traditional IC tests would typically occur after wafer 102 is diced, separating the ICs fabricated thereon, and the individual ICs are packaged using appropriate materials (e.g., plastic). Each of the packaged ICs would include pins that would facilitate insertion of the IC into a socket.

In contrast, the present invention can enable testing of unpackaged ICs as they sit on an undiced wafer. Such testing can be advantageous, for example, in testing "flip chips," which often don't require a package even in final form. Instead, a flip chip can be inverted and coupled to a board using solder or other appropriate conducting materials. Such testing can also be advantageous when applied to transmitter and receiver circuitry of an IC that is operative to transmit wireless data signals. As described above, wafer-level testing of wireless transmitter and receiver circuitry can be relatively difficult, costly, or both.

Such transmitter and receiver circuitry can be used to transmit RF signals, including wireless local-area network ("WLAN") signals, or any other appropriate signals. For example, WLAN signals complying with the 802.11 wireless networking standard can be transmitted at a frequency substantially equal to 2.4 GHz. As another example, such signals can be transmitted at a frequency substantially between 5 GHz ad 6 GHz. In an embodiment of the invention, transmitter and receiver circuitry on an IC can support multiple signal frequencies (e.g., through dual-band transmitters and receivers if two frequency ranges are desirable). In yet another example, Global System for Mobile Communications ("GSM") or General Packet Radio Service ("GPRS") signals can be sent at approximately 800 MHz or approximately between 1800 and 1900 MHz.

In accordance with an embodiment of the invention, test control circuitry 106 can communicate with at least one IC on undiced wafer 102. Test control circuitry 106 can, for example, transmit signals to initiate, end, or otherwise control testing of the at least one IC. Test control circuitry 106 can preferably communicate with multiple ICs on wafer 102 substantially simultaneously (e.g., in parallel). The signals can be sent to core circuitry of the at least one IC, which can in turn communicate with transmitter and receiver circuitry on the IC. Power circuitry 108 can be associated with test control circuitry 106 and can supply power to test control circuitry 108, at least one IC on wafer 102, or both. Test control circuitry 106 preferably records test status data in memory 104, which is also associated with test control circuitry 106. For example, test control circuitry 106 can record information indicating which ICs generated errors (e.g., because of an unsuccessful signal transmission, signal reception, or both).

Figure 2:
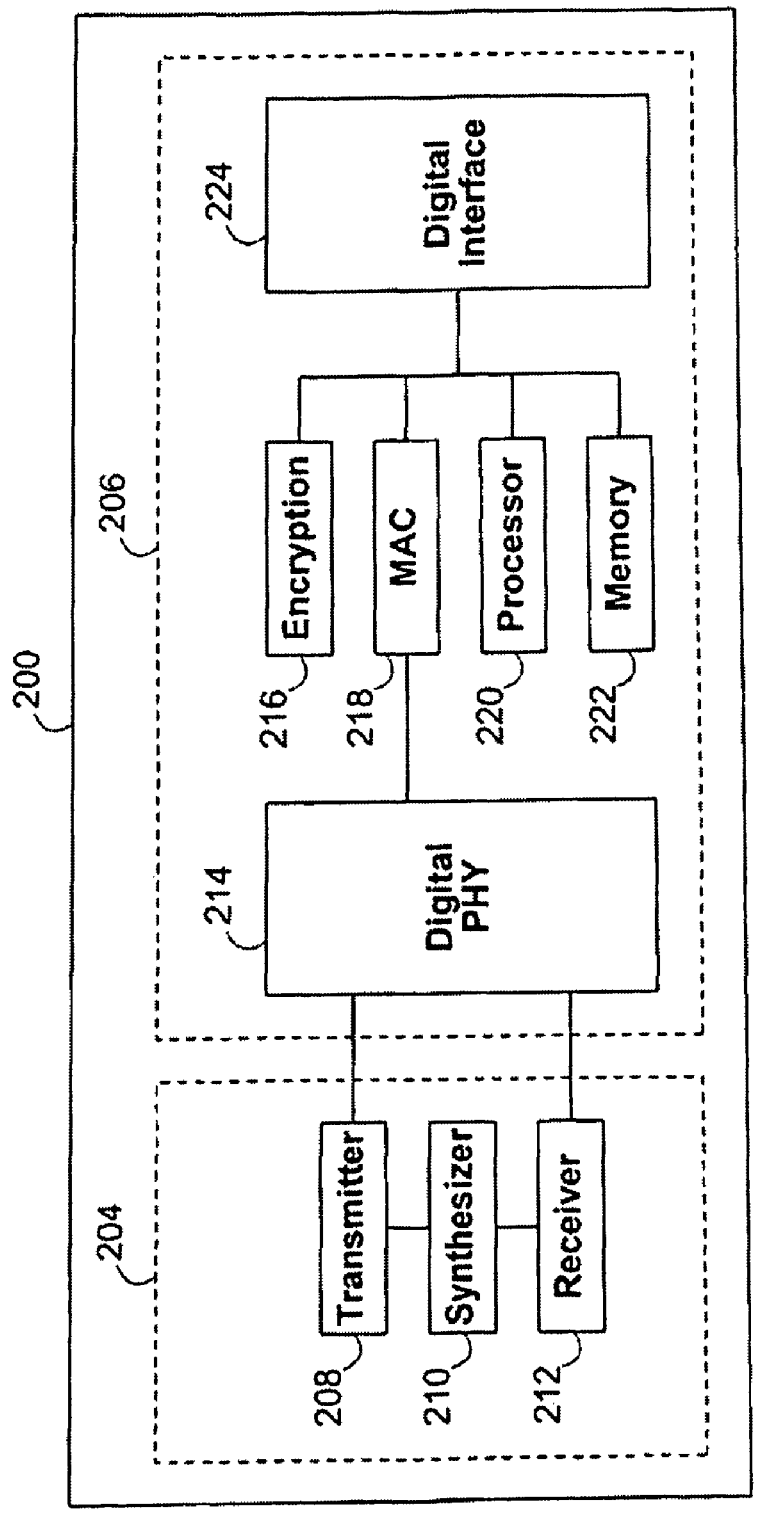
FIG. 2 is a block diagram of an illustrative integrated circuit according to an embodiment of the invention.

FIG. 2 is a block diagram of an illustrative IC 200 according to an embodiment of the invention. IC 200 preferably supports system-on-a-chip ("SOC") functionality. IC 200 can include transceiver circuitry 204 and core circuitry 206. Transceiver circuitry 204 preferably includes transmitter circuitry 208, synthesizer circuitry 210, and receiver circuitry 212.

Synthesizer circuitry 210 preferably provides at least one clock signal corresponding to appropriate signal frequencies, and supplies the at least one clock signal to transmitter circuitry 208 and receiver circuitry 212. For example, transmitter circuitry 208 and receiver circuitry 212 may support dual-band transmission and receipt, respectively, of WLAN signals at approximately 2.4 GHz and approximately 5 GHz. In that case, synthesizer circuitry 210 could transmit a clock signal of approximately 10 GHz to both transmitter circuitry 208 and receiver circuitry 212, which could in turn divide the 10 GHz clock signal to provide second and third signals of approximately 2.4 GHz and 5 GHz. Alternatively, synthesizer 210 could transmit clock signals at both approximately 5 GHz and approximately 2.4 GHz.

Transmitter circuitry 208 can be operable to transmit wireless data signals, and receiver circuitry 212 can be operable to receive such signals. During normal operation of IC 200, only one of transmitter 208 and receiver 212 would typically be operating at any given time. In accordance with an embodiment of the invention, however, transmitter circuitry 208 and receiver circuitry 212 can be coupled to each other (e.g., through a transmission line), so that signals transmitted by transmitter circuitry 208 can be received by receiver 212 in a loopback testing mode.

Core circuitry 206 can include digital physical layer ("PHY") circuitry 214, which can facilitate communication between transmitter circuitry 208, receiver circuitry 212, and media access control ("MAC") circuitry 218. MAC circuitry 218 is preferably coupled to encryption circuitry 216, processor circuitry 220, and memory circuitry 222 (e.g., through a shared bus). The shared bus is preferably coupled to digital interface 224, which preferably facilitates communication between IC 200 and other hardware (e.g., a circuit board on which IC 200 is mounted).

Core circuitry 206 preferably controls testing of transmitter circuitry 208 and receiver circuitry 212. For instance, core circuitry 206 can receive a signal from test control circuitry 106, and transmit at least one signal to transmitter circuitry 208 in response. When transmitter circuitry 208 receives that signal, it can transmit at least one signal to receiver circuitry 212. Receiver circuitry 212, upon receiving the signal from transmitter 208 (or a signal based on the transmitted signal), can in turn transmit at least one signal back to core circuitry 206. At this point, core circuitry 206 can determine whether or not the transmission of the signal from transmitter circuitry 208 was successful, whether the receipt of the signal at receiver circuitry 212 was successful, or both.

As an example, core circuitry 206 could instruct transmitter circuitry 208 to transmit a signal, or sequence of signals, to receiver circuitry 212. Receiver circuitry 212 could in turn transmit the received signal, or sequence of signals, to core circuitry 206, which could compare the data transmitted by transmitter circuitry 208 to the data received by receiver circuitry 212. If there is a mismatch between the two sets of data, core circuitry 206 could record the failed test status in memory circuitry 222. Alternatively, core circuitry 206 could transmit a signal to test control circuitry 106, which could record the failed test status in memory circuitry 104. Similarly, if the test were successful, that test status could be recorded in memory circuitry 222 or in memory circuitry 104. It will be understood that other types of testing could be used. For example, core circuitry 200 could compute a checksum on a sequence of signals received from receiver circuitry 212 and record a failed test status if the computed checksum is invalid.

Figure 3:
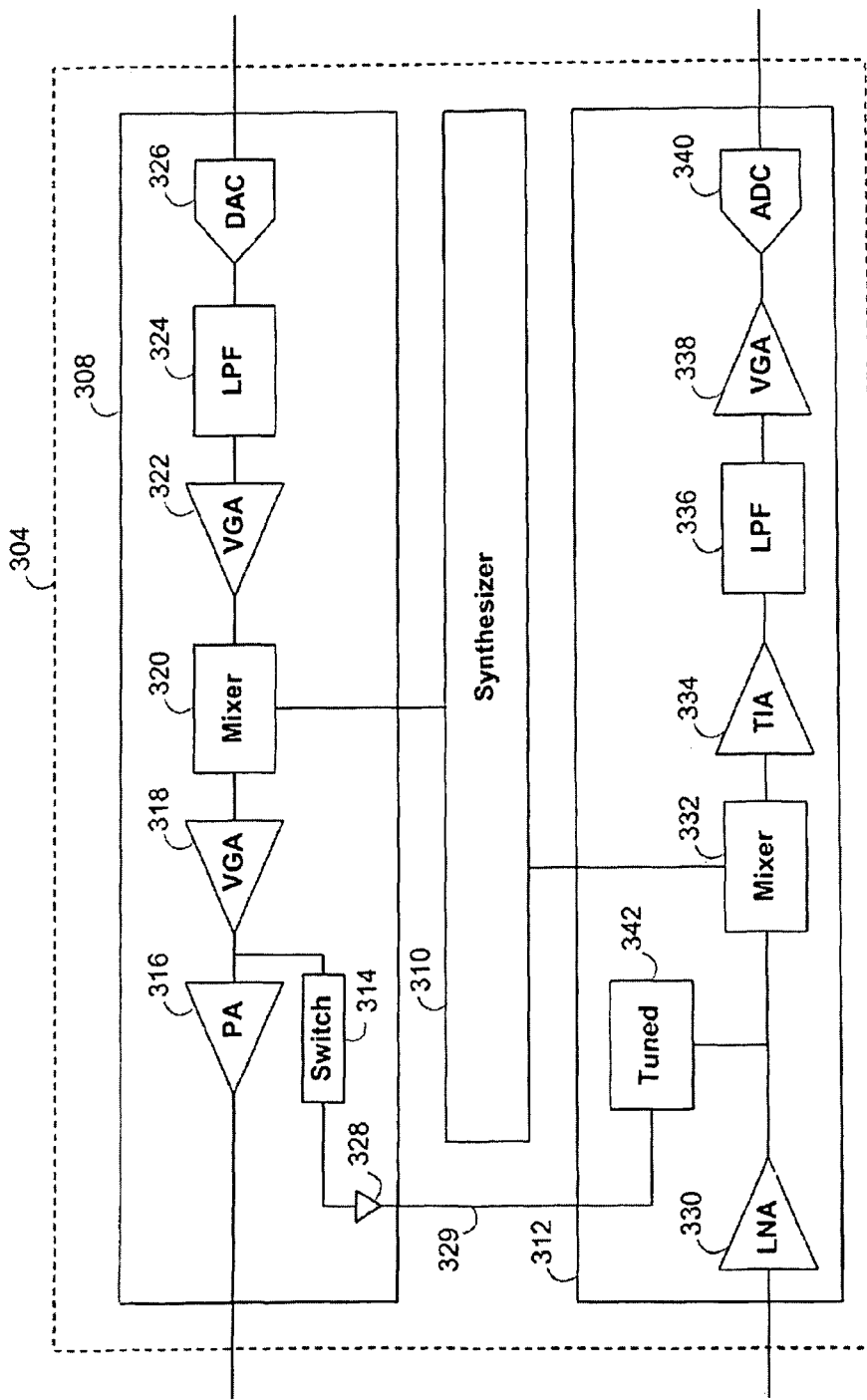
FIG. 3 is a block diagram of illustrative RF transceiver circuitry according to an embodiment of the invention.

FIG. 3 is a block diagram of illustrative transceiver circuitry 304 according to an embodiment of the invention. Transceiver circuitry 304 can be used as transceiver circuitry 204 of IC 200, and preferably includes transmitter circuitry 308, synthesizer circuitry 310, and receiver circuitry 312. As previously discussed in connection with synthesizer circuitry 210, synthesizer circuitry 310 preferably generates at least one clock signal of appropriate frequency that is supplied to both transmitter circuitry 308 and receiver circuitry 312. Synthesizer circuitry 310 can include any appropriate circuitry, such as a phase-locked loop or a delay-locked loop.

Transmitter circuitry 308 preferably accepts a digital signal from the core circuitry of the IC on which transceiver circuitry 304 resides. This digital signal is preferably processed by digital-to-analog converter 326, to generate an analog signal of appropriate voltage levels. The signal is then preferably processed by low-pass filter 324 and variable-gain amplifier 322. The baseband output of variable gain amplifier 322 is preferably modulated by mixer circuitry 320.

Mixer circuitry 320 preferably accepts a clock signal from synthesizer 310 that modulates the output signal of variable-gain amplifier 322. For example, synthesizer circuitry 310 could generate a clock signal of approximately 10 GHz, and mixer circuitry 320 could include a divider circuit that accepts the synthesized clock signal and generates a divided clock signal of approximately 2.4 GHz, which is then used to modulate the baseband output signal of variable-gain amplifier 322, such that the output of mixer circuitry 320 is compliant with 802.11 WLAN transmission standards. It will be understood that other clock signal frequencies and transmission standards can be used (e.g., 800 MHz for GSM standards), and the invention is not limited in these respects. The modulated output of mixer 320 is then preferably processed by variable-gain amplifier 318 and power amplifier 316. The output signal of power amplifier 316 can then be transmitted to an output pad of the IC on which transceiver circuitry 304 resides. Preferably, the output signal of variable-gain amplifier circuitry 318 can also be transmitted to switching circuitry 314 in accordance with an embodiment of the invention.

Switching circuitry 314 can include transistor circuitry, tristate buffer circuitry, demultiplexing circuitry, or any other appropriate circuitry. Switching circuitry 314 preferably facilitates activation of a loopback testing mode of the invention. In the illustrative embodiment shown in FIG. 3, switching circuitry 314 can be coupled to the output signal of variable-gain amplifier circuitry 318 in parallel with power amplifier circuitry 328. If loopback testing mode is enabled (e.g., in response to a signal received from core circuitry), the output of variable-gain amplifier circuitry 318 is preferably coupled to driver circuitry 328, which preferably has a relatively low gain. Driver circuitry 328 can preferably be activated and deactivated, in order to conserve power when not in use. In addition, driver circuitry 328 preferably has an adjustable gain, which can be set to an appropriate fraction to generate a relatively low-power output signal. The output of driver circuitry 328 is preferably sent to receiver circuitry 312 through transmission line 329. Advantageously, the loopback testing mode of the invention can be activated without substantially interfering with the normal transmission path of transmitter circuitry 308, which can include power amplifier circuitry 316. In an embodiment of the invention, transceiver circuitry 304 can support more than one mode of testing, and switching circuitry 314 can switch between all supported modes (e.g., responsive to a signal received from core circuitry).

Receiver circuitry 312 preferably includes low-noise amplifier 330, which receives signals from outside the IC on which transceiver circuitry 304 resides. Low-noise amplifier 330 is preferably adapted to amplify relatively low-power signals (e.g., those transmitted over a relatively long distance). Although the output signal of transmitter circuitry 308 may be weakened by variable-strength driver 328, low-noise amplifier 330 may still be relatively ill-suited to receive that signal. Thus, in an embodiment of the invention, the output of driver circuitry 328 can bypass low-noise amplifier 330 during loopback testing. The looped-back signal can be received by loopback signal receiver circuitry 342, which preferably has a variable current, which can preferably be adjusted to match the impedance of transmission line 329. In addition, loopback signal receiver circuitry 342 can preferably be activated and deactivated, in order to conserve power when not in use. An illustrative implementation of loopback signal receiver circuitry 342 is described later in connection with FIG. 4.

In accordance with the invention, loopback signal receiver circuitry 342 is preferably activated when the loopback testing mode of the invention is enabled (e.g., in response to a signal received from core circuitry). When loopback signal receiver circuitry 342 is activated, it preferably couples the output of driver circuitry 328 to an input of mixer circuitry 332. In this case, the output signal of low-noise amplifier circuitry 330 can be additively combined with the output signal of loopback signal receiver circuitry 342, and mixer circuitry 332 can receive the combined signal as an input. Thus, the loopback testing mode of the invention can allow an output signal of transmitter circuitry 308 to be looped back to receiver circuitry 312 through transmission line 329. In an embodiment of the invention, transceiver circuitry 304 can support more than one mode of testing, and switching circuitry 331 can switch between all supported modes (e.g., responsive to a signal received from core circuitry).

Mixer circuitry 332 can serve substantially the reverse purpose of mixer circuitry 320, and preferably accepts a clock signal from synthesizer 310 to demodulate the output signal of low-noise amplifier circuitry 330. For example, synthesizer circuitry 310 could generate a clock signal of approximately 10 GHz, and mixer circuitry 332 could include a divider circuit that accepts the synthesized clock signal and generates a divided clock signal of approximately 2.4 GHz, which is then used to demodulate the received WLAN signal, such that the output of mixer circuitry 320 oscillates at an approximately baseband frequency. The demodulated output of mixer 332 is then preferably processed by transimpedance amplifier 334, low-pass filter 336, and variable-gain amplifier 338. Finally, the output signal of variable-gain amplifier 338 is preferably processed by analog-to-digital converter 340 to generate digital signals. The resulting digital signal is preferably transmitted to the core circuitry of the IC on which I/O circuitry 304 resides.

The loopback testing methods and apparatus of the invention therefore facilitate efficient wafer-level testing of ICs. As previously mentioned, the invention can be especially advantageous when applied to transmitter and receiver circuitry that are capable of transmitting wireless data signals, as special probes for interacting with such transmitter and receiver circuitry are often area-intensive and impractical to use. For example, one such probe may require a pair of companion ground lines for each associated signal line. By leveraging the existing transmitter and receiver circuitry present on an IC, relatively quick tests can be performed without the need for a significant amount of added complexity or area.

It will be noted that the present invention can be used in conjunction with other testing techniques. For instance, relatively comprehensive testing can be performed on a representative prototype IC (or several such ICs) to verify the integrity of a design. Such testing can account for real-world conditions, such as signal attenuation and reflections in the air that are associated with the transmission and receipt of wireless data signals. After such relatively comprehensive testing has been performed, wafers can be fabricated using the verified IC design, and the loopback testing of the invention can be used to screen for defective ICs.

In addition, it will be understood that the embodiments of the invention described above are merely illustrative, and other implementations are possible. For instance, FIG. 3 shows a single transmitter 308 and a single transmitter 312 in I/O circuitry 304. However, an alternative embodiment of the invention could include a dual-band transmitter that included two separate transmitters, each operating at a distinct frequency. Similarly, the invention could include a dual-band receiver that included two separate receivers, each operating at a distinct frequency. In such a case, a single synthesizer 310 could still provide the required clock signals, and appropriate frequency adjustments could be made in the individual mixer circuits. In addition, multiple transmitters and receivers operating at substantially the same frequency can be used in a multiple-input-multiple-output ("MIMO") transceiver. As another example, transmitter circuitry 308 and receiver circuitry 312 could support transmission and receipt, respectively, of differential signals.

The stages of transmitter circuitry 308 and receiver circuitry 312 are merely illustrative, and other structures are possible. Moreover, it will be understood that loopback testing could be provided between stages other than those corresponding to power amplifier 316 and mixer circuitry 332. For instance, a baseband loopback could be provided from the output of variable-gain amplifier 322 to the input of transimpedance amplifier 334. Such testing could be appropriate, for example, if it were desirable to focus on the baseband components of the transmitter and receiver circuitry (e.g., for efficiency reasons), and if it were not necessary to test the remaining stages of the transmitter and receiver circuitry using loopback techniques of the invention.

Figure 4:
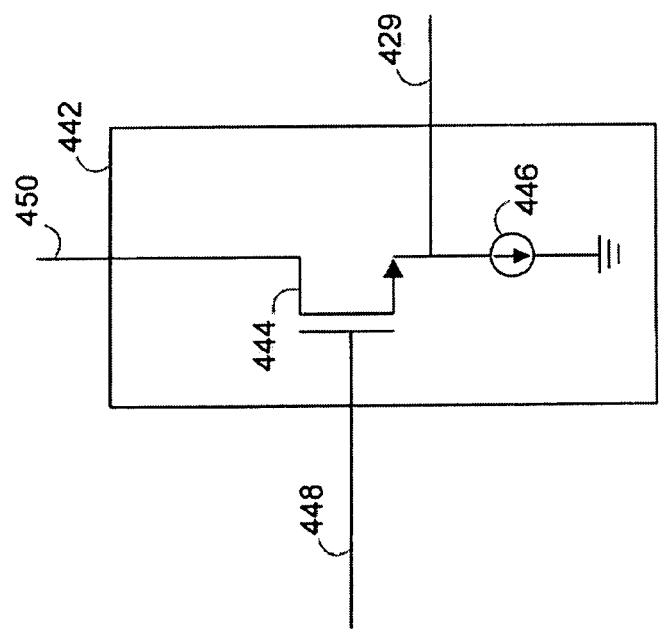
FIG. 4 is a circuit diagram of an illustrative loopback signal receiver circuit according to an embodiment of the invention.

FIG. 4 is a circuit diagram of an illustrative loopback signal receiver circuit 442 according to an embodiment of the invention. Loopback signal receiver circuit 442 can be used as loopback signal receiver circuitry 342 in transceiver circuitry 304, and preferably includes transistor 444 and current source 446, which preferably has a relatively high impedance. Input 429 is preferably coupled to a transmission line (e.g., looped back from transmitter circuitry). Output 450 is preferably coupled to receiver circuitry (e.g., to an input of mixer circuitry 332 in FIG. 3). The bias current of transistor 444 can preferably be varied to adjust the impedance at input 429. By setting the current level of current source 446 to an appropriate level, the impedance at input 429 can be substantially matched to the characteristic impedance of the transmission line to which input 429 is coupled. Advantageously, such impedance matching can substantially eliminate signal reflections on the transmission line. It will be noted that the implementation illustrated by loopback signal receiver circuit 442 is merely illustrative, and a variety of other circuits can be used.

Referring now to FIGS. 5A-5E, various exemplary implementations of the present invention are shown.

Figure 5A:
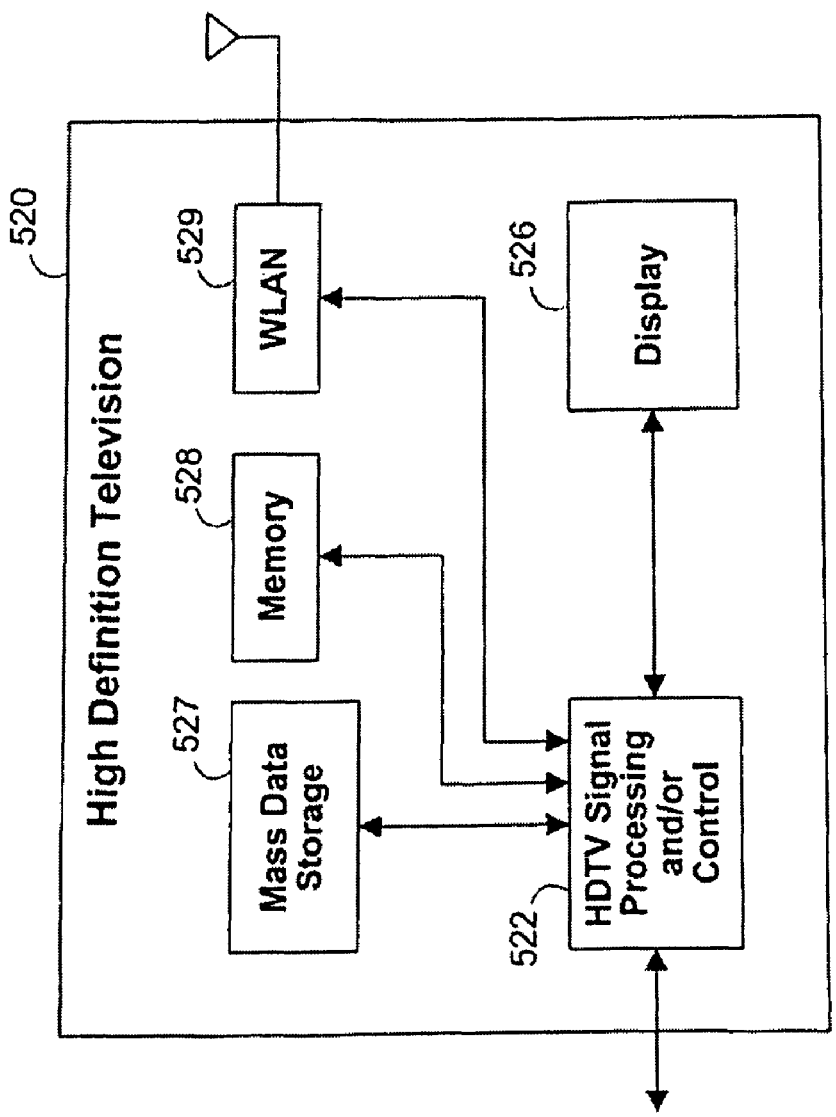
FIG. 5A is a block diagram of an exemplary high definition television that can employ the disclosed technology.

Referring to FIG. 5A, the present invention can be implemented in a high definition television (HDTV) 520. The present invention may implement either or both signal processing and/or control circuits, which are generally identified in FIG. 5A at 522, a WLAN interface and/or mass data storage of the HDTV 520. The HDTV 520 receives HDTV input signals in either a wired or wireless format and generates HDTV output signals for a display 526. In some implementations, signal processing circuit and/or control circuit 522 and/or other circuits (not shown) of the HDTV 520 may process data, perform coding and/or encryption, perform calculations, format data and/or perform any other type of HDTV processing that may be required.

The HDTV 520 may communicate with mass data storage 527 that stores data in a nonvolatile manner such as optical and/or magnetic storage devices. The HDD may be a mini HDD that includes one or more platters having a diameter that is smaller than approximately 1.8". The HDTV 520 may be connected to memory 528 such as RAM, ROM, low latency nonvolatile memory such as flash memory and/or other suitable electronic data storage. The HDTV 520 also may support connections with a WLAN via a WLAN network interface 529.

Figure 5B:
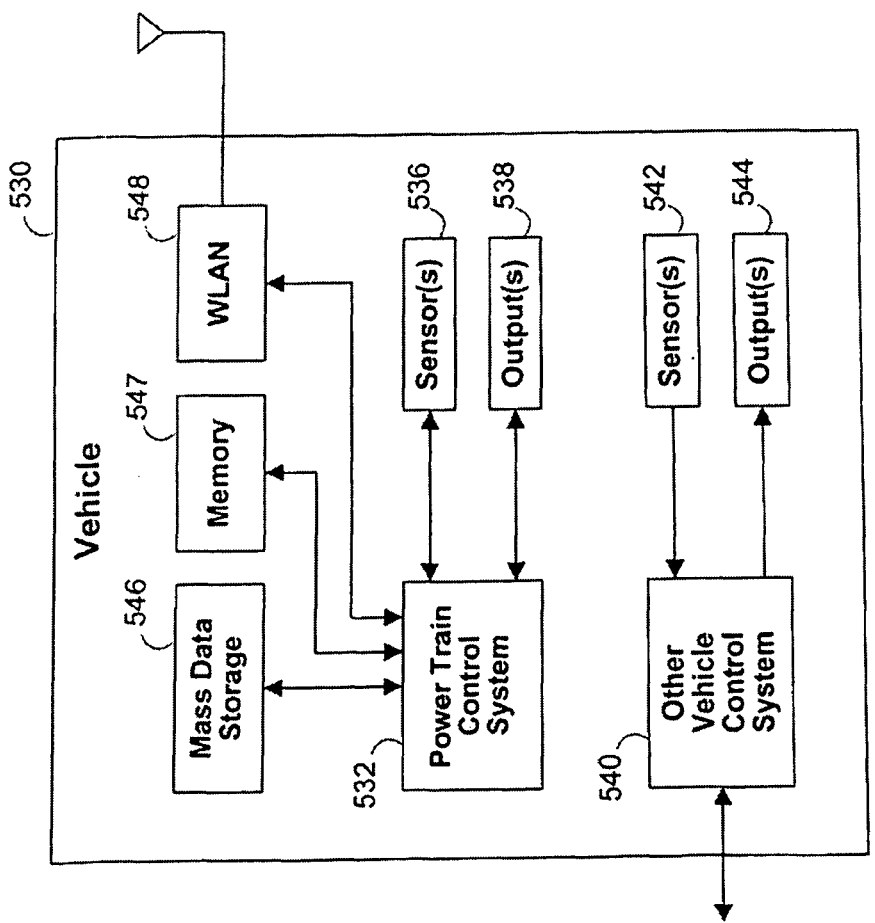
FIG. 5B is a block diagram of an exemplary vehicle that can employ the disclosed technology.

Referring to FIG. 5B, the present invention implements a control system of a vehicle 530, a WLAN interface and/or mass data storage of the vehicle control system. In some implementations, the present invention may implement a powertrain control system 532 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 540 of the vehicle 530. The control system 540 may likewise receive signals from input sensors 542 and/or output control signals to one or more output devices 544. In some implementations, the control system 540 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 532 may communicate with mass data storage 546 that stores data in a nonvolatile manner. The mass data storage 546 may include optical and/or magnetic storage devices for example hard disk drives HDD and/or DVDs. The HDD may be a mini HDD that includes one or more platters having a diameter that is smaller than approximately 1.8". The powertrain control system 532 may be connected to memory 547 such as RAM, ROM, low latency nonvolatile memory such as flash memory and/or other suitable electronic data storage. The powertrain control system 532 also may support connections with a WLAN via a WLAN network interface 548. The control system 540 may also include mass data storage, memory and/or a WLAN interface (all not shown).

Figure 5C:
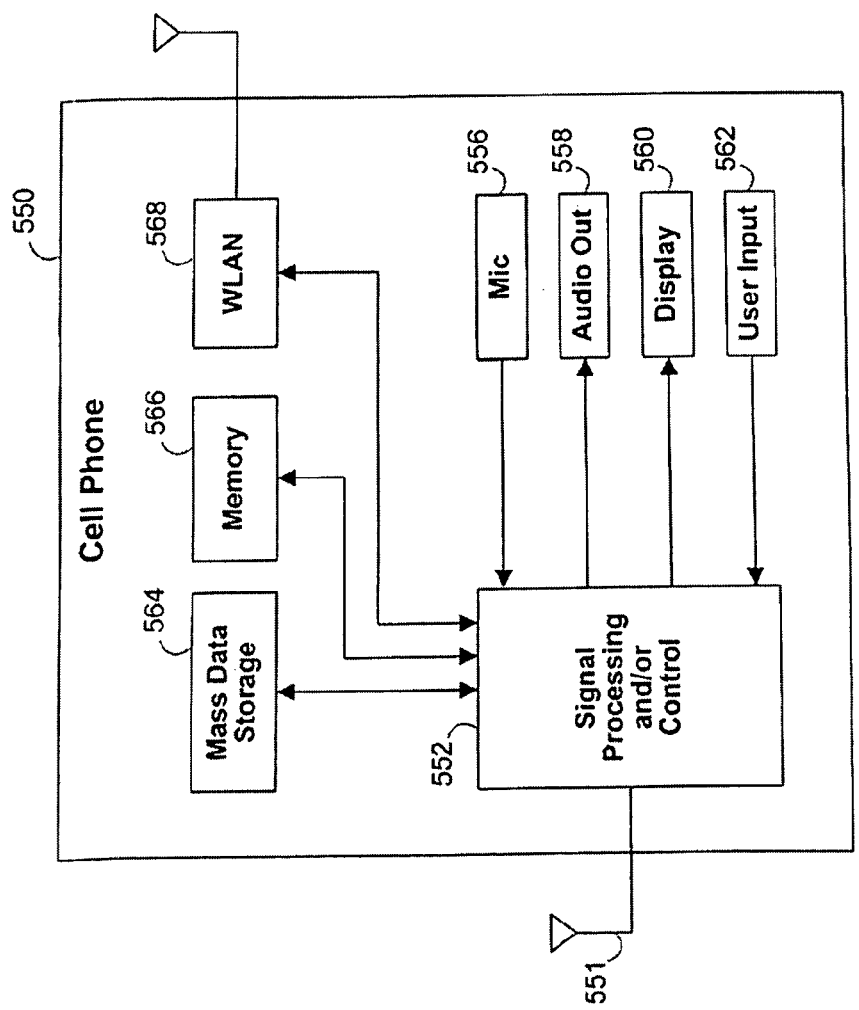
FIG. 5C is a block diagram of an exemplary cell phone that can employ the disclosed technology.

Referring to FIG. 5C, the present invention can be implemented in a cellular phone 550 that may include a cellular antenna 551. The present invention may implement either or both signal processing and/or control circuits, which are generally identified in FIG. 5C at 552, a WLAN interface and/or mass data storage of the cellular phone 550. In some implementations, the cellular phone 550 includes a microphone 556, an audio output 558 such as a speaker and/or audio output jack, a display 560 and/or an input device 562 such as a keypad, pointing device, voice actuation and/or other input device. The signal processing and/or control circuits 552 and/or other circuits (not shown) in the cellular phone 550 may process data, perform coding and/or encryption, perform calculations, format data and/or perform other cellular phone functions.

The cellular phone 550 may communicate with mass data storage 564 that stores data in a nonvolatile manner such as optical and/or magnetic storage devices for example hard disk drives HDD and/or DVDs. The HDD may be a mini HDD that includes one or more platters having a diameter that is smaller than approximately 1.8". The cellular phone 550 may be connected to memory 566 such as RAM, ROM, low latency nonvolatile memory such as flash memory and/or other suitable electronic data storage. The cellular phone 550 also may support connections with a WLAN via a WLAN network interface 568.

Figure 5D:
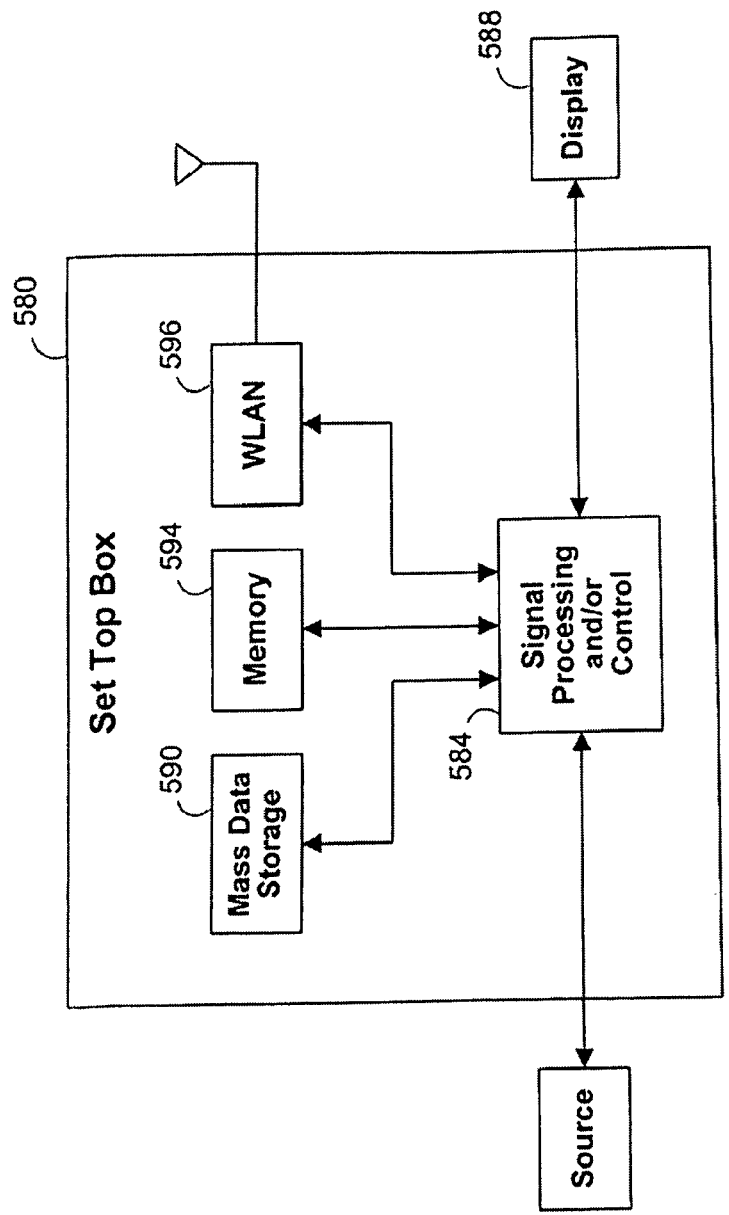
FIG. 5D is a block diagram of an exemplary set top box that can employ the disclosed technology.

Referring to FIG. 5D, the present invention can be implemented in a set top box 580. The present invention may implement either or both signal processing and/or control circuits, which are generally identified in FIG. 5D at 584, a WLAN interface and/or mass data storage of the set top box 580. The set top box 580 receives signals from a source such as a broadband source and outputs standard and/or high definition audio/video signals suitable for a display 588 such as a television and/or monitor and/or other video and/or audio output devices. The signal processing and/or control circuits 584 and/or other circuits (not shown) of the set top box 580 may process data, perform coding and/or encryption, perform calculations, format data and/or perform any other set top box function.

The set top box 580 may communicate with mass data storage 590 that stores data in a nonvolatile manner. The mass data storage 590 may include optical and/or magnetic storage devices for example hard disk drives HDD and/or DVDs. The HDD may be a mini HDD that includes one or more platters having a diameter that is smaller than approximately 1.8". The set top box 580 may be connected to memory 594 such as RAM, ROM, low latency nonvolatile memory such as flash memory and/or other suitable electronic data storage. The set top box 580 also may support connections with a WLAN via a WLAN network interface 596.

Figure 5E:
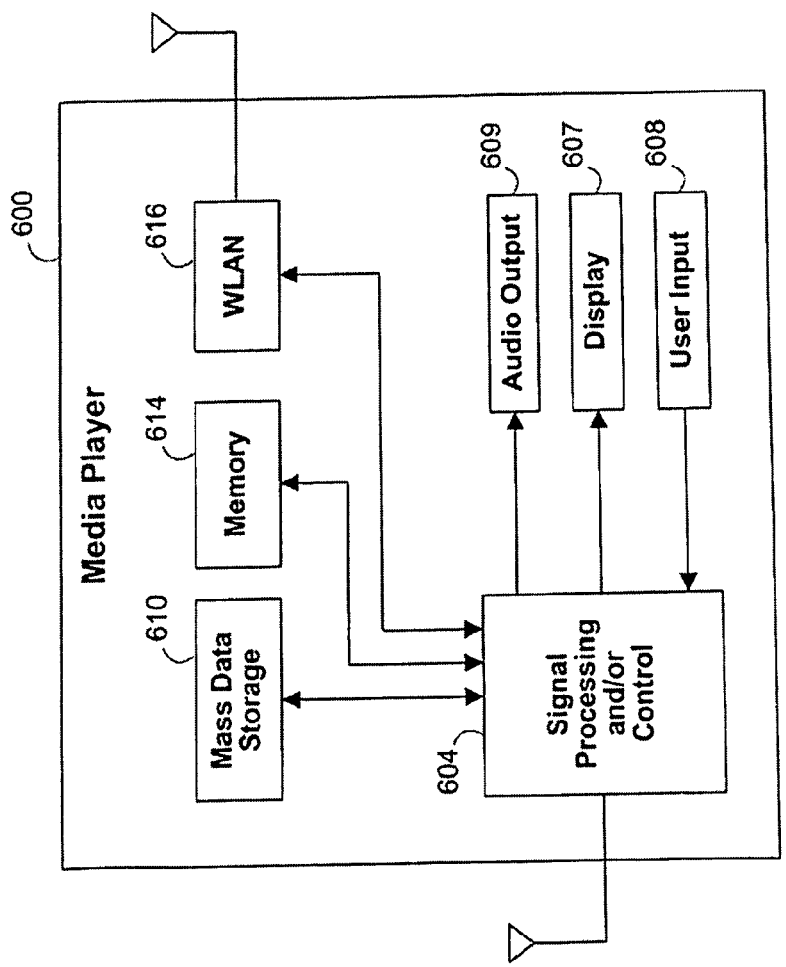
FIG. 5E is a block diagram of an exemplary media player that can employ the disclosed technology.

Referring now to FIG. 5E, the present invention can be implemented in a media player 600. The present invention may implement either or both signal processing and/or control circuits, which are generally identified in FIG. 5E at 604, a WLAN interface and/or mass data storage of the media player 600. In some implementations, the media player 600 includes a display 607 and/or a user input 608 such as a keypad, touchpad and the like. In some implementations, the media player 600 may employ a graphical user interface (GUI) that typically employs menus, drop down menus, icons and/or a point-and-click interface via the display 607 and/or user input 608. The media player 600 further includes an audio output 609 such as a speaker and/or audio output jack. The signal processing and/or control circuits 604 and/or other circuits (not shown) of the media player 600 may process data, perform coding and/or encryption, perform calculations, format data and/or perform any other media player function.

The media player 600 may communicate with mass data storage 610 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. The HDD may be a mini HDD that includes one or more platters having a diameter that is smaller than approximately 1.8". The media player 600 may be connected to memory 614 such as RAM, ROM, low latency nonvolatile memory such as flash memory and/or other suitable electronic data storage. The media player 600 also may support connections with a WLAN via a WLAN network interface 616. Still other implementations in addition to those described above are contemplated.

Thus it is seen that methods and apparatus are provided for achieving efficient wafer-level testing of ICs. One skilled in the art will appreciate that the invention can be practiced by other than the described embodiments, which are presented for purposes of illustration and not of limitation, and the present invention is limited only by the claims which follow.

What is claimed is:
1. At least one integrated circuit ("IC") comprising:
core circuitry;
transmitter circuitry for transmitting a first signal through a transmission line;
receiver circuitry for receiving a second signal based on the first signal and for transmitting a third signal to the core circuitry in response to receiving the second signal, wherein the first signal is transmitted to the receiver circuitry; and
memory circuitry for recording a test status in response to receiving the third signal at the core circuitry.

2. The at least one IC of claim 1 wherein the at least one IC comprises a plurality of ICs on an undiced wafer.

3. The at least one IC of claim 1 wherein the transmitter circuitry and the receiver circuitry are operative to send and receive, respectively, wireless data signals.

4. The at least one IC of claim 1 wherein the memory circuitry is associated with test control circuitry external to the at least one IC.

5. The at least one IC of claim 1 wherein the memory circuitry is associated with the core circuitry of the at least one IC.

6. The at least one IC of claim 1 wherein the recorded test status indicates success of transmitting the first data signal.

7. The at least one IC of claim 1 wherein the recorded test status indicates success of receiving the second data signal.

8. The at least one IC of claim 1 wherein the recorded test status indicates whether the first signal is substantially equal to the second signal.

9. The at least one IC of claim 1 further comprising driver circuitry coupled to the transmission line.

10. The at least one IC of claim 9 wherein:
the transmitter circuitry comprises a variable-gain amplifier; and
the driver circuitry is further coupled to an output of the variable-gain amplifier.

11. The at least one IC of claim 9 wherein the driver circuitry can be activated.

12. The at least one IC of claim 1 wherein the receiver circuitry comprises mixer circuitry coupled to the transmission line.

13. The at least one IC of claim 12 wherein the receiver circuitry further comprises low-noise amplifier circuitry coupled to the transmission line.

14. The at least one IC of claim 12 wherein the at least one IC further comprises loopback signal receiver circuitry coupled to the transmission line and the mixer circuitry.

15. The at least one IC of claim 13 wherein the loopback signal receiver circuitry can be activated.

16. At least one integrated circuit ("IC") comprising:
core circuitry for receiving a first signal;
transmitter circuitry for transmitting a second signal through a transmission line in response to receiving the first signal at the core circuitry; and
receiver circuitry for receiving a third signal based on the second signal and for transmitting a fourth signal to the core circuitry in response to receiving the third signal, wherein the second signal is transmitted to the receiver circuitry.

17. The at least one IC of claim 16 wherein:
the at least one IC comprises a plurality of ICs on an undiced wafer; and
the first signal is received at each of the plurality of ICs substantially simultaneously.

18. The at least one IC of claim 16 wherein the first signal is received from test control circuitry external to the at least one IC.

19. The at least one IC of claim 18 further comprising a power supply associated with the test control circuitry for providing a power supply voltage to the core circuitry of the at least one IC.

20. The at least one IC of claim 18 wherein the core circuitry is operative to transmit a fifth signal to the test control circuitry in response to receiving the fourth signal at the core circuitry.

21. A method for testing at least one integrated circuit ("IC"), the method comprising:
receiving a first signal at core circuitry of the at least one IC;
transmitting a second signal from transmitter circuitry of the at least one IC to receiver circuitry of the at least one IC through a transmission line in response to receiving the first signal;
receiving at the receiver circuitry a third signal based on the second signal; and
transmitting a fourth signal from the receiver circuitry to the core circuitry of the at least one IC in response to the receiving the third signal.

* * * * *